(12) United States Patent
Jacob

(10) Patent No.: US 6,795,329 B2
(45) Date of Patent: Sep. 21, 2004

(54) MEMORY INTEGRATED CIRCUIT

(75) Inventor: Michael Jacob, Yokohama (JP)

(73) Assignee: Infineon Technologies Aktiengesellschaft, Munich (DE)

(*) Notice: Subject to any disclaimer, the term of this patent is extended or adjusted under 35 U.S.C. 154(b) by 40 days.

(21) Appl. No.: 10/177,324

(22) Filed: Jun. 20, 2002

(65) Prior Publication Data
US 2003/0237011 A1 Dec. 25, 2003

(51) Int. Cl.⁷ .............................................. G11C 11/00
(52) U.S. Cl. ...................................... 365/145; 365/149
(58) Field of Search ................................. 365/145, 149

(56) References Cited

U.S. PATENT DOCUMENTS 5,903,492 A * 5/1999 Takashima ................... 365/145
2003/0142534 A1 * 7/2003 Takashima ................... 365/149

* cited by examiner

Primary Examiner—Huan Hoang
(74) Attorney, Agent, or Firm—Horizon IP Pte Ltd

(57) ABSTRACT

An improved memory IC whose memory cells are configured in a chain architecture is disclosed. The first diffusion regions of the cell transistors of the chain are coupled to first capacitor electrodes while the second diffusion regions are coupled to second capacitor electrodes. This ensures that the electric field applied across any of the capacitors of the chain by a plateline pulse is in the same direction. This reduces or avoids asymmetrical hysteresis curves for adjacent memory cells, thereby the improving sensing window.

13 Claims, 10 Drawing Sheets

US 6,795,329 B2

MEMORY INTEGRATED CIRCUIT

FIELD OF THE INVENTION

The present invention relates to integrated circuits (ICs). More particularly, the invention relates to memory ICs, for example, ferroelectric memory ICs, with series architecture.

BACKGROUND OF THE INVENTION

Ferroelectric metal oxide ceramic materials such as lead zirconate titanate (PZT) have been investigated for use in ferroelectric semiconductor memory devices. Other ferroelectric materials, for example, strontium bismuth tantalate (SBT) can also be used. FIG. 1 shows a conventional ferroelectric memory cell 105 having a transistor 130 and a ferroelectric capacitor 140. A capacitor electrode 142 is coupled to a plateline 170 and another capacitor electrode 141 is coupled to the transistor 130 which selectively couples or decouples the capacitor from a bitline 160, depending on the state (active or inactive) of a wordline 150 coupled to the transistor gate.

The ferroelectric memory stores information in the capacitor as remanent polarization. The logic value stored in the memory cell depends on the polarization of the ferroelectric capacitor. To change the polarization of the capacitor, a voltage which is greater than the switching voltage (coercive voltage) needs to be applied across its electrodes. An advantage of the ferroelectric capacitor is that it retains its polarization state after power is removed, resulting in a non-volatile memory cell.

FIG. 2 shows a plurality of ferroelectric memory cells configured in a chain 202. Such a memory architecture is described in, for example, Takashima et al., Symposium on VLSI Circuits (1997), which is herein incorporated by reference for all purposes. The memory cells 205 of the chain, each comprises a transistor 230 coupled to a capacitor 240 in parallel, are coupled in series. Gates 233 of the cell transistors, for example, are gate conductors which serve as or are coupled to wordlines. One end 208 of the chain is coupled to a bitline while the other end 209 is coupled to a plateline. A plurality of chains are interconnected by wordlines to form a memory block or array.

FIG. 3 shows a conventional cross-section of a memory chain 302. As shown, the transistors 330 of the memory cells 305 are formed on a substrate 310. Adjacent cell transistors shared a common diffusion region. The capacitors 340 of the memory chain are grouped in pairs. The bottom electrode 341 serves as a common electrode for adjacent capacitors. The top electrode 342 of a capacitor from a capacitor pair is coupled to the upper electrode of a capacitor of an adjacent pair, thus forming a daisy chain. The top capacitor electrodes are coupled to the cell transistors via active area top electrode plugs 386.

During standby or when the memory chain is not selected for a memory access, the wordlines of the chain are active to render the cell transistors of the chain conductive. The capacitors of the chain are shorted when transistors are conductive. To retrieve or read information from one memory cell of the chain, a pulse (e.g., 2.5V) is provided at the plateline. The wordline corresponding to the row address of the memory access is deactivated, causing the transistor of the selected cell to be non-conductive. As a result, the pulse produces an electric field across the capacitor of the selected cell.

Due to the sharing of diffusion regions between adjacent cell transistors and sharing of top and bottom electrodes of adjacent cell capacitors, the electric field will be in different directions for adjacent cells. As indicated, even addressed memory cells will have an electric field applied in a first direction while odd addressed memory cells have an electric field in a second or opposite direction. Alternating external electric field directions across capacitors for odd and even addresses results in an asymmetrically shaped hysteresis curves for odd and even addresses. As a result, the read signal for odd and even address locations will be different. This leads to a broadening of read signal distributions, as shown in FIG. 4, undesirably reducing sensing window.

From the foregoing discussion, it is desirable to provide an improved chained architecture which avoids asymmetrical hysteresis curves for odd and even address locations.

SUMMARY OF THE INVENTION

The invention relates to memory ICs. The memory cells are arranged in a chain memory having x memory cells. A memory comprises a transistor having first and second diffusion regions and a capacitor having dielectric layer between first and second electrodes. One of the electrodes is a bottom electrode and the other one is a top electrode. The first electrode is coupled to the first diffusion region and the second electrode is coupled to the second diffusion region.

In one embodiment, the memory cells are ferroelectric memory cells in which the ferroelectric capacitors each comprises a ferroelectric layer between the first and second electrodes. The cell transistors, for example, are n-FETs.

In one embodiment, the memory cells are interconnected by having the second electrode of the $k^{th}$ memory cell of the chain coupled to the first electrode of the $k^{th}+1$ memory cell of the chain. By interconnecting the memory cells of the chain in such a manner, the electric fields applied across any of the capacitors of the chain by a plateline pulse are in the same direction. As a result, the memory cells of the chain produce more symmetrical hysteresis curves, thereby improving the sensing window.

DETAILED DESCRIPTION OF THE INVENTION

Figure 1:
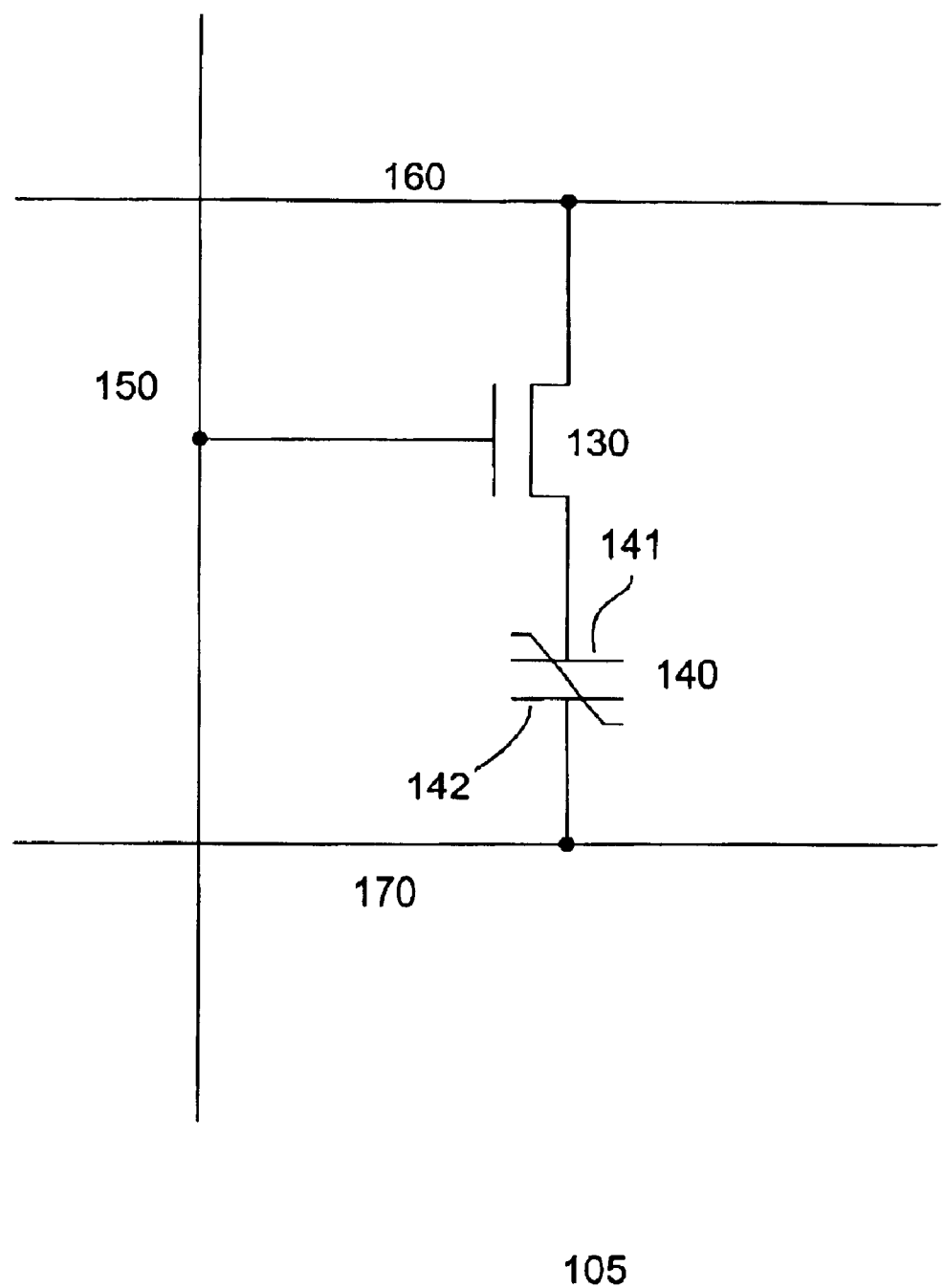
FIG. 1 shows a conventional ferroelectric memory cell.
Figure 2:
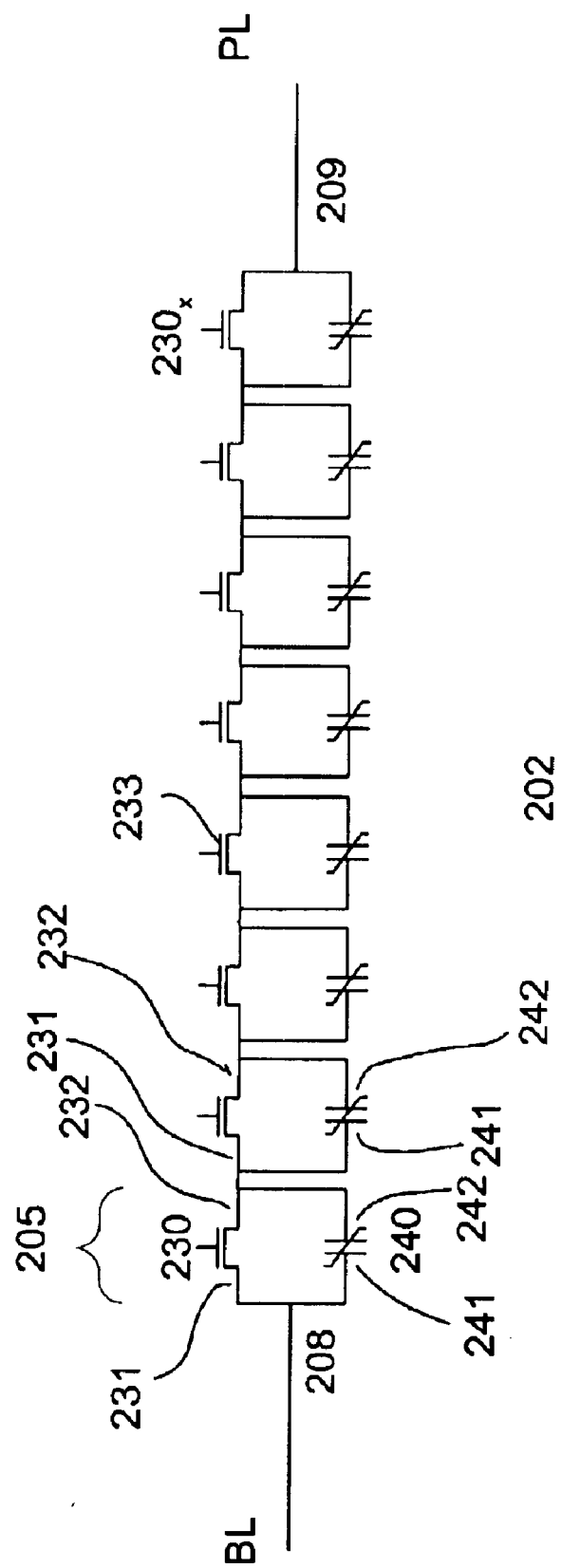
FIG. 2 shows a conventional memory chain.
Figure 3:
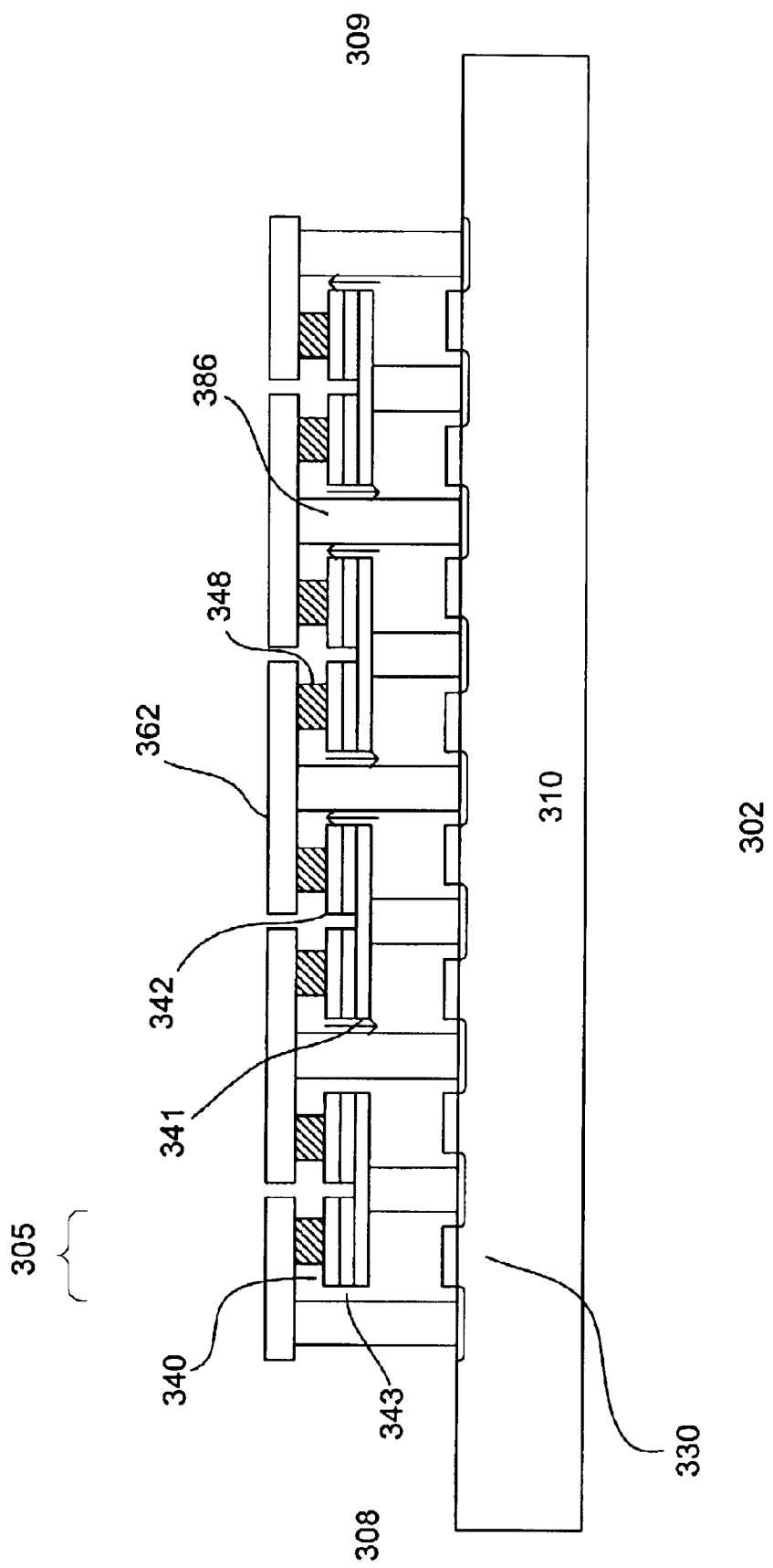
FIG. 3 shows a cross-sectional view of a conventional memory chain.
Figure 4:
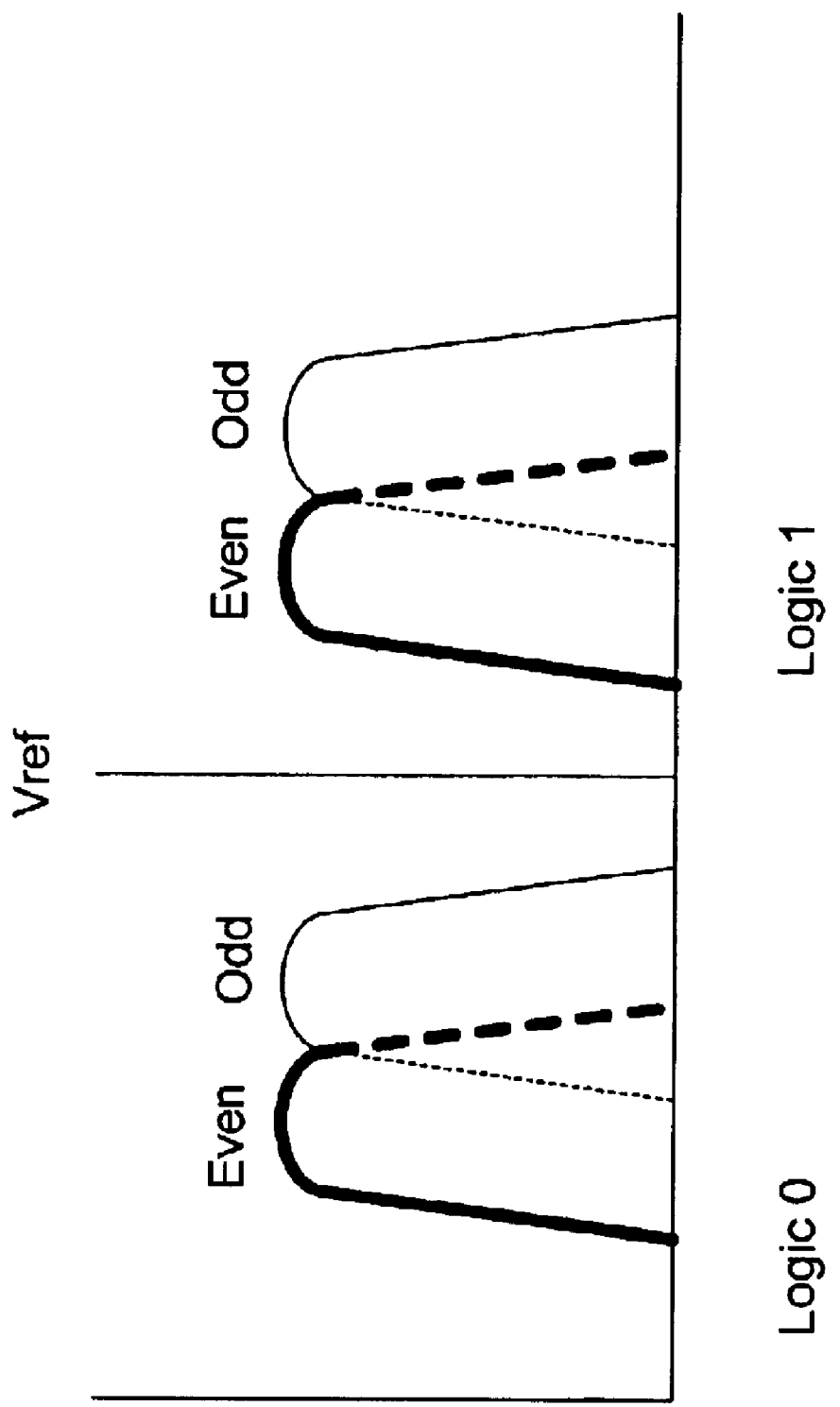
FIG. 4 shows the read signal distribution of conventional chained memory architecture.
Figure 5:
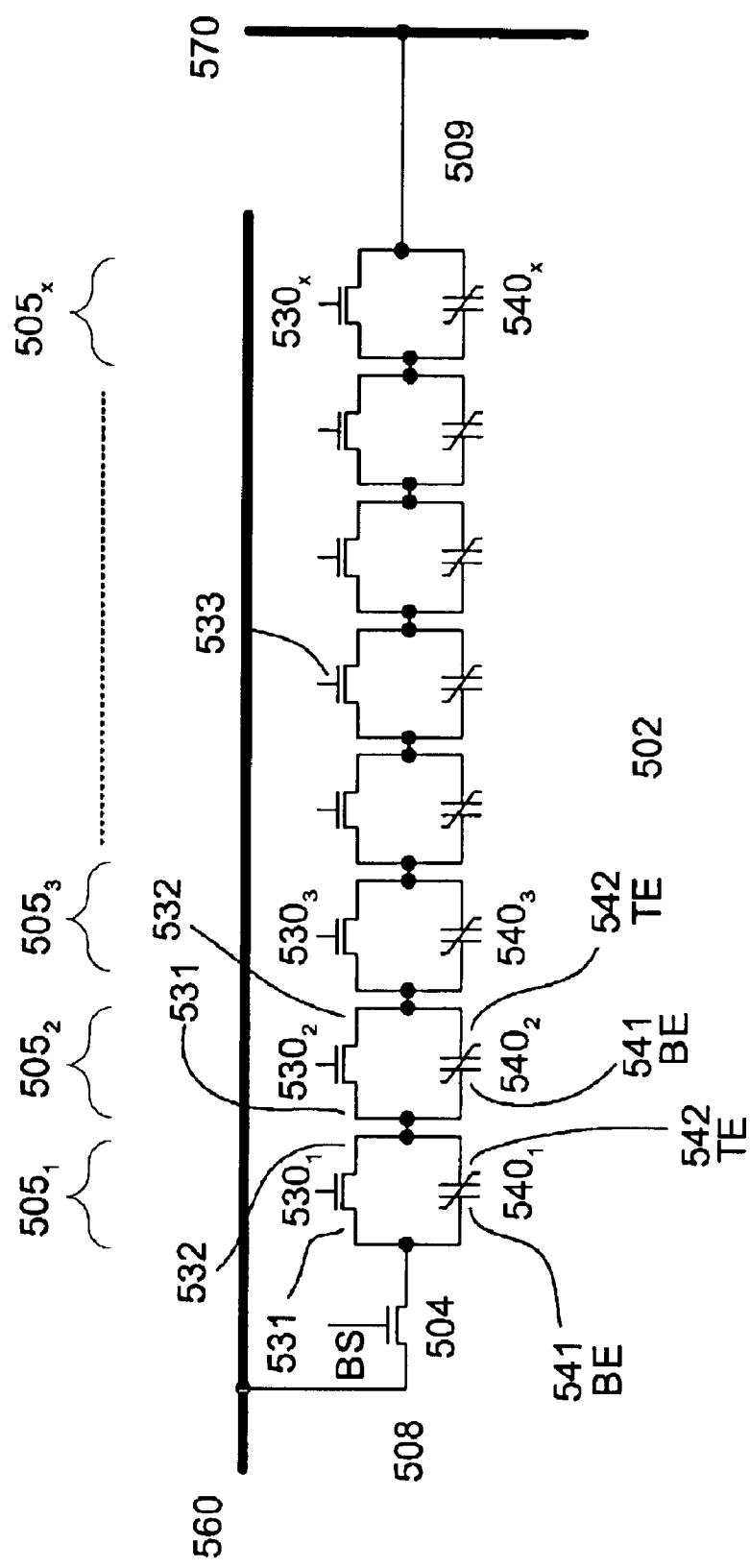
FIG. 5 shows one embodiment of the invention for reducing asymmetrical hysteresis curves for odd and even address locations.

FIG. 5 shows a memory chain 502 in accordance with one embodiment of the invention. As shown, the chain comprises a plurality of memory cells $505_1$–$505_x$, each having a transistor 530 and a capacitor 540. In one embodiment, the chain comprises eight memory cells (e.g., x=8). Providing memory chains of other sizes is also useful. Preferably, the number of memory cells in the chain is equal to $2^y$, where y is a whole number (e.g., $x=2^y$). A transistor comprises first and second diffusion regions 531 and 532 and a capacitor comprises first and second plates 541 and 542. The first plate, for example, is the bottom electrode and the second plate is the top electrode. The transistors, for example, are n-FETs. Other types of transistors, such as p-FETs or a combination of n and p-FETs, can also be used. The first transistor diffusion region is coupled to the first capacitor plate while the second transistor diffusion region is coupled to the second capacitor plate.

The memory cells are coupled in series to form the chain. In accordance with one embodiment of the invention, the same side of each cell transistor (e.g., first or second diffusion region 531 or 532) is coupled to the same type of capacitor electrode (first or second electrode 541 or 542). For example, the source (e.g., first diffusion region 531) of each cell transistor is coupled to the bottom capacitor electrode BE and the drain (e.g., second diffusion region 532) of each cell transistor is coupled to the top capacitor electrode TE. Alternatively, the source of each cell transistor is coupled to the top capacitor electrode while the drain is coupled to the bottom capacitor electrode.

To interconnect one cell to the another, one type of capacitor electrode of one cell is coupled to another type of electrode of an adjacent cell. If, for example, the BE is coupled to the first diffusion region and the TE is coupled to the second diffusion region in each cell, the top electrode of the capacitor in the first cell 505$_1$ of the chain is coupled to BE of the capacitor of second cell 505$_2$. Alternatively, the first capacitor electrode is the top electrode and the second capacitor is the bottom electrode.

Gates 533 of the cell transistors can be gate conductors which serve as or are coupled to wordlines. A first end of 508 of the chain is coupled to a bitline 560. In one embodiment, a selection transistor 504 is coupled between the first end of the chain and the bitline 560. The selection transistor is controlled by a block select signal to selectively couple or decouple the chain from the bitline. A second end 509 of the chain is coupled to a plateline 570. For chains with an even number of memory cells, the first diffusion regions of the cell transistors at the end of the chain are coupled to either the bitline or plateline, depending on which end of the chain. A plurality chains are interconnected by wordlines to form a memory block or array.

By coupling the memory cells in series in accordance with the invention, the electric field applied across any capacitor of the chain during a read operation irrespective of the address location is in the same direction. As a result, the hysteresis loops of the memory cells of the chain are substantially symmetrical. This reduces or avoids different read signals for odd and even address locations, thereby increasing read signal margin.

Figure 6:
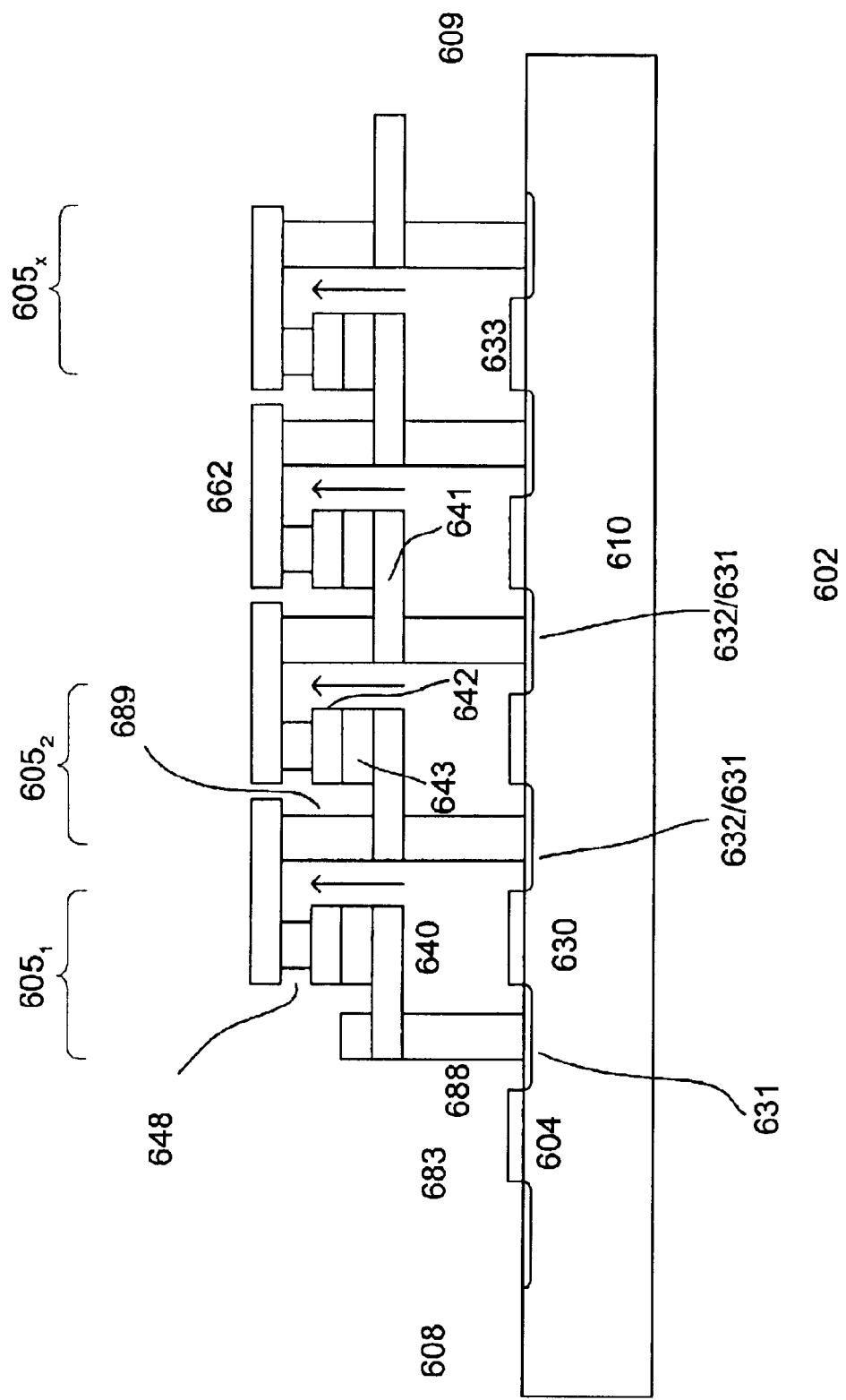
FIG. 6 shows a cross-sectional view of a memory chain in accordance with one embodiment of the invention.

FIG. 6 shows a cross section of a memory chain 602 in accordance with one embodiment of the invention. The memory chain comprises a plurality of memory cells 605$_1$–605$_x$ formed on a substrate 610. Illustratively, the chain comprises four memory cells (e.g., x=4). The memory cells each comprises a cell transistor 630 and a capacitor 640. The transistors of the memory, in one embodiment, are n-FETs. Each cell transistor includes first and second diffusion regions 631 and 632. In one embodiment, adjacent transistors share a common diffusion region 632/631. Sharing of diffusion regions between adjacent transistors advantageously reduces cell size. At a first end of the chain is a selection transistor 604 having a first diffusion region coupled to a bitline. The other diffusion region is a common diffusion region with the first cell transistor. A plateline is coupled to a second end 609 of the chain.

In one embodiment, the capacitor of a memory cell is a ferroelectric capacitor. The ferroelectric capacitor includes a ferroelectric layer 643 between first and second electrodes 641 and 642. Conductive material such as noble metal can be used to form the electrodes. Other types of conductive materials such as SRO or IrO are also useful. It is not necessary that the first and second electrodes be formed from the same type of material. The ferroelectric material, in one embodiment, comprises PZT. SBT or other types of ferroelectric material can also be used. As shown, the first electrode is the bottom electrode and the second electrode is the top electrode. The bottom and top electrodes are respectively coupled to first and second diffusion regions of a cell transistor, forming a parallel coupling between the transistor and capacitor of a memory cell. An encapsulation layer can cover the capacitors to serve as a barrier against contaminants, such as hydrogen. The encapsulation layer can be formed from, for example, alumina. Other types of encapsulation layer can also be used.

In one embodiment, the top capacitor electrode of a memory cell is coupled to the bottom capacitor electrode from an adjacent memory cell. Illustratively, top capacitor electrode of memory cell 605$_K$ is coupled to the bottom capacitor electrode of memory cell 605$_{K+1}$, where k is from 1 to x−1. For the last memory cell 605$_x$ of the chain, the top electrode is only coupled to the second transistor diffusion region.

The bottom electrode is coupled to the first diffusion region of a cell transistor or common diffusion region of adjacent transistors via a bottom capacitor plug 688. The bottom capacitor plug, for example, comprises a conductive material such as tungsten (W). Other types of conductive materials, including for example polysilicon, or aluminum, are also useful. A barrier layer, such as iridium, can be provided to inhibit diffusion of oxygen to reduce or prevent oxidation of the plug. An adhesion layer (not shown) may also be provided between the barrier and plug to promote adhesion between the barrier and interlevel dielectric (ILD) layer 683.

The bottom electrode extends beyond the upper portion of the capacitor (e.g., ferroelectric and top electrode layers) to provide a contact area for coupling to the top electrode of an adjacent capacitor. Illustratively, the bottom electrode extends at least on one side from the plug, allowing the upper portion of the capacitor to be offset from the plug. The capacitor, for example, is formed over the gate of the cell transistor. Alternatively, the upper portion of the capacitor is formed over the plug, while the contact area to the upper electrode of an adjacent capacitor is offset from the plug. Other layouts for providing the contact area to the top electrode of an adjacent capacitor are also useful.

The top electrode of a capacitor, in one embodiment, is coupled to the bottom capacitor electrode of an adjacent memory cell via top capacitor plug 648, upper portion of bottom capacitor plug 689 and conductive line 662. Alternative techniques of coupling the top electrode of a capacitor to a bottom electrode of an adjacent capacitor are also useful. Such techniques, include, for example, strap techniques and single metal layer for contact and line.

During a read, a pulse is applied to the chain via the plateline, producing an electric field across the capacitor of the selected memory cell. The electric field, irrespective of the address location, is applied in the direction of the bottom capacitor plate towards the top capacitor plate, as indicated by the arrows. Alternatively, an electric field in the opposite direction can be applied to the capacitor of the selected cell by having the first transistor diffusion region coupled to the top capacitor electrode and second transistor diffusion region coupled to the bottom capacitor electrode. This would also mean the bottom capacitor electrode of memory cell k is coupled to the top capacitor electrode of memory cell k+1.

Figure 7:
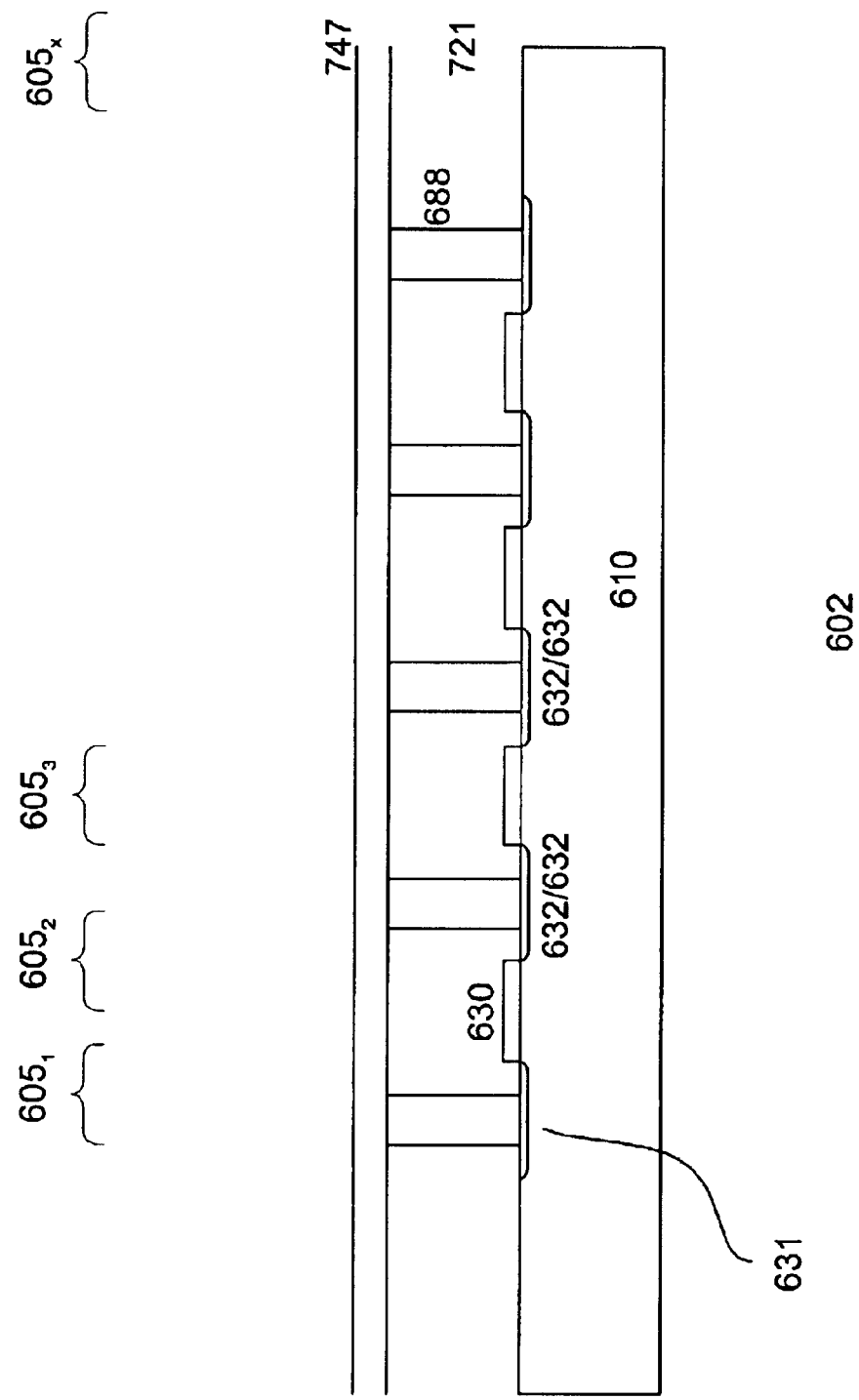
FIGS. 7–10 show a process for forming a memory chain in accordance with one embodiment of the invention.

FIGS. 7–10 show a process for forming a memory chain in accordance with one embodiment of the invention. Referring to FIG. 7, a semiconductor substrate 610 is provided. The substrate is prepared with cell transistors of the memory chain. Other components for IC (not shown) can also be prepared on the substrate. The cell transistors, in one embodiment, share a common diffusion region with adjacent cell transistors. The cell transistors, for example, are n-FETs. A selection transistor (not shown) can also be provided on the substrate. The selection transistor shares a common diffusion region with the first cell transistor.

An ILD layer 721 is provided over the substrate. The ILD, for example, comprises silicon oxide. Other types of dielectric materials, such as silicon nitride, doped or undoped silicate glass, or spin-on glass, are also useful. Various techniques can be used to form the ILD, such as chemical vapor deposition (CVD).

Lower capacitor electrode plugs 688 are formed in the ILD layer. The lower capacitor electrode plugs are coupled to respective diffusion regions of the cell transistors. The plugs, for example, comprise a conductive material such as poly-Si. Other types of conductive material, such as tungsten (W), can also be used.

The plugs are formed using conventional techniques. For example, a resist layer is deposited on the ILD layer and patterned to form openings corresponding to vias in which plugs are formed. An anisotropic etch, such as reactive ion etching (RIE), is then performed. The RIE removes portions of the ILD layer exposed by the resist mask, creating vias. A conductive material is then deposited on the substrate, filling the vias. Excess conductive material over the ILD is then removed by, for example, chemical mechanical polishing. The CMP creates a planar surface between the plugs and ILD.

A liner layer can be deposited on the substrate to line the via walls prior to filling the vias. The liner layer serves to facilitate the filling process. A barrier can also be provided to line the via walls. The barrier layer inhibits diffusion of oxygen and/or hydrogen to prevent plug oxidation. Various materials, such as Ti and TiN, can be used to serve as the liner and barrier layers. Depending on whether the liner and/or barrier layers are conductive or not, the bottom of the via may be removed to expose the diffusion region.

After the plugs are formed, a conductive layer 747 is deposited on the ILD layer by conventional techniques. The conductive layer serves as the bottom capacitor electrode. The conductive layer, for example, comprises a noble metal such as platinum. Other types of conductive materials are also useful.

In one embodiment, a barrier layer is formed prior to depositing the conductive layer. The barrier layer comprises, for example, iridium. Other materials which can inhibit the diffusion of oxygen, such as IrO, can also be used. To promote adhesion between the barrier layer and ILD, an adhesion layer can be provided beneath the barrier layer. The adhesion layer comprises, in one embodiment, Ti. Other types of adhesion promoting materials can also be used to serve as the adhesion layer. Various techniques, for example sputtering, can be used to form the barrier and adhesion layers.

For applications where the plug comprises poly-Si, a metal silicide layer is formed over the ILD prior to the capacitor layers. The metal silicide, for example comprises titanium or cobalt. Other metal silicides are also useful. The metal silicide is formed by, for example, conventional techniques.

Figure 8:
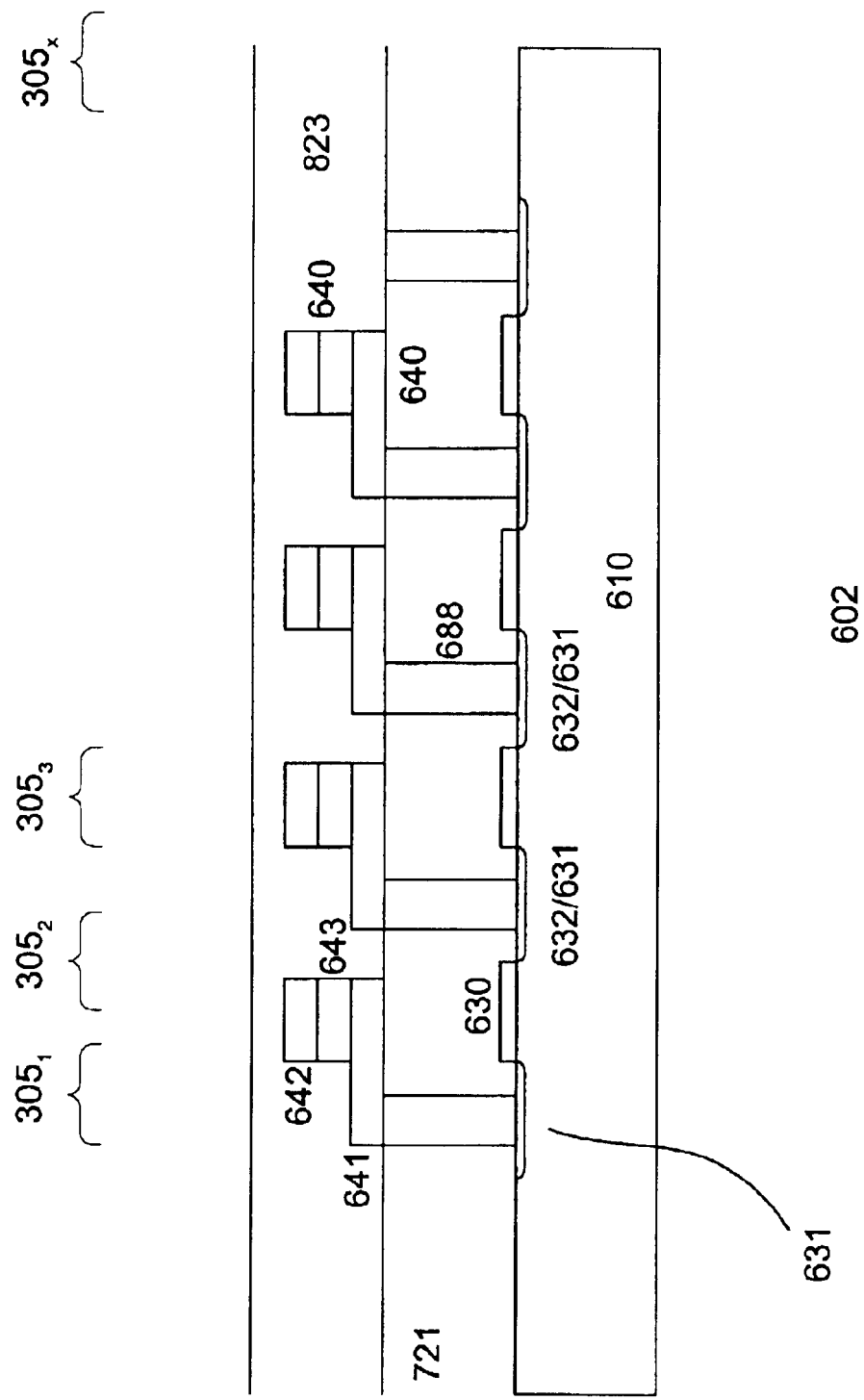

Referring to FIG. 8, the conductive layer is patterned to form bottom capacitor electrodes 641. Patterning of the conductive layer is achieved using, for example, conventional mask and etch techniques. The bottom capacitor electrodes are coupled to respective bottom capacitor electrode plugs. In one embodiment, the bottom capacitor electrodes extend on one side from the plugs and over the gates of cell transistors. Other layouts are also useful. The various layers of the upper portion of the capacitor are deposited over the substrate, covering the ILD and bottom capacitor electrodes. In one embodiment, various layers include ferroelectric and top electrode layers. The ferroelectric layer, for example, comprises PZT while the top electrode layer comprises a noble metal, such as platinum. Other types of ferroelectric and top electrode layers can also be used. These layers are patterned to form upper portion of the capacitors 640. Various conventional techniques, such as masking and etching, can be used to pattern the different layers.

A dielectric layer 823 is deposited over the substrate, covering the capacitors. Various types of dielectric materials can be used. In one embodiment, an encapsulation layer is formed over the capacitor prior to depositing the dielectric layer. Materials such as alumina or other types of materials that can inhibit diffusion of hydrogen can also be used.

Figure 9:
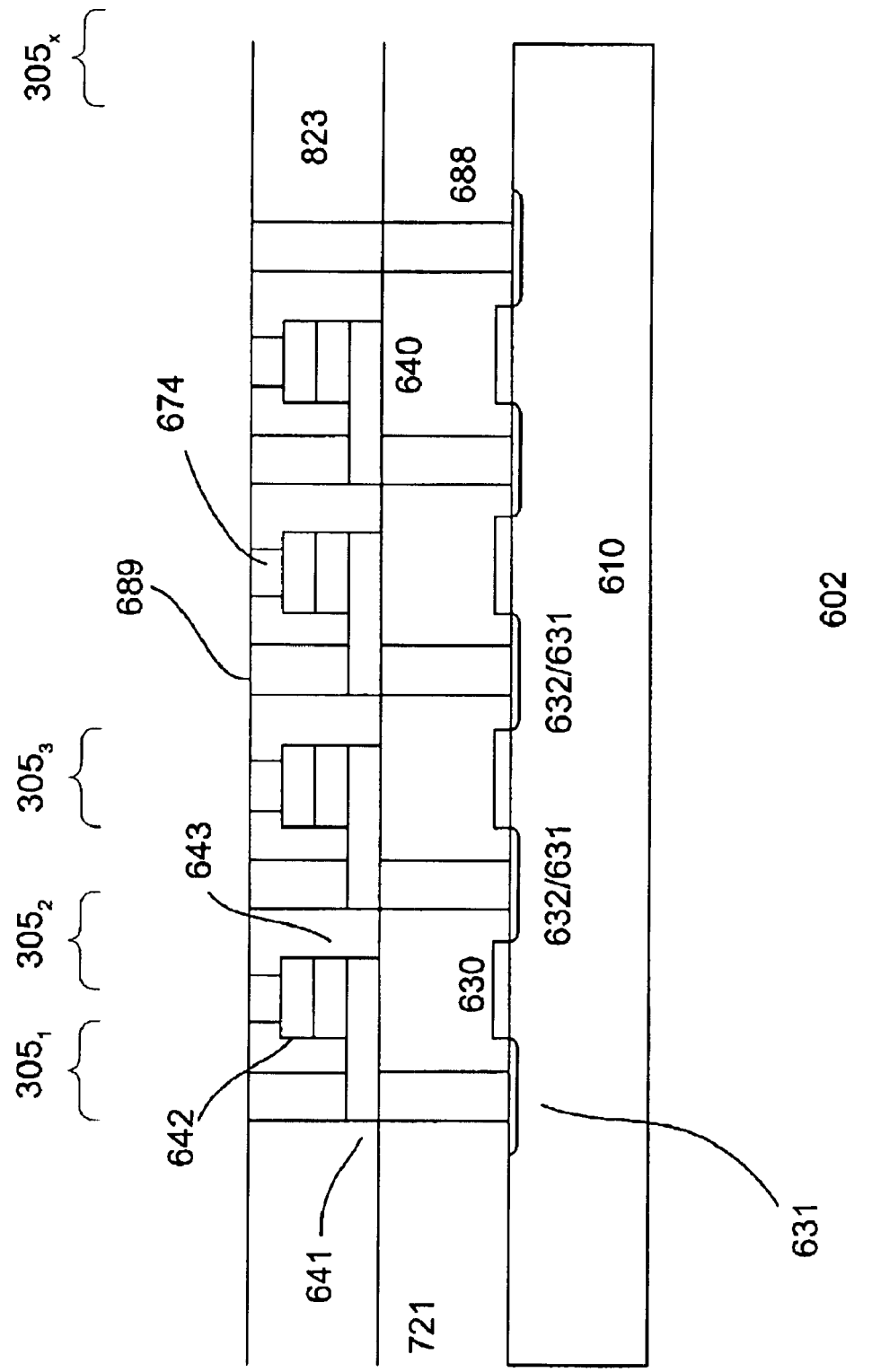

Referring to FIG. 9, plugs 689 and 674 which contact the bottom and top electrodes respectively are formed in the dielectric layer. In one embodiment, the plugs comprise tungsten. Other types of conductive materials can such as aluminum can also be used. The plugs are formed by conventional techniques. Such techniques include, for example, forming vias in the dielectric layer and filling them with conductive material. Excess conductive materials are removed by polishing, such as CMP.

Figure 10:
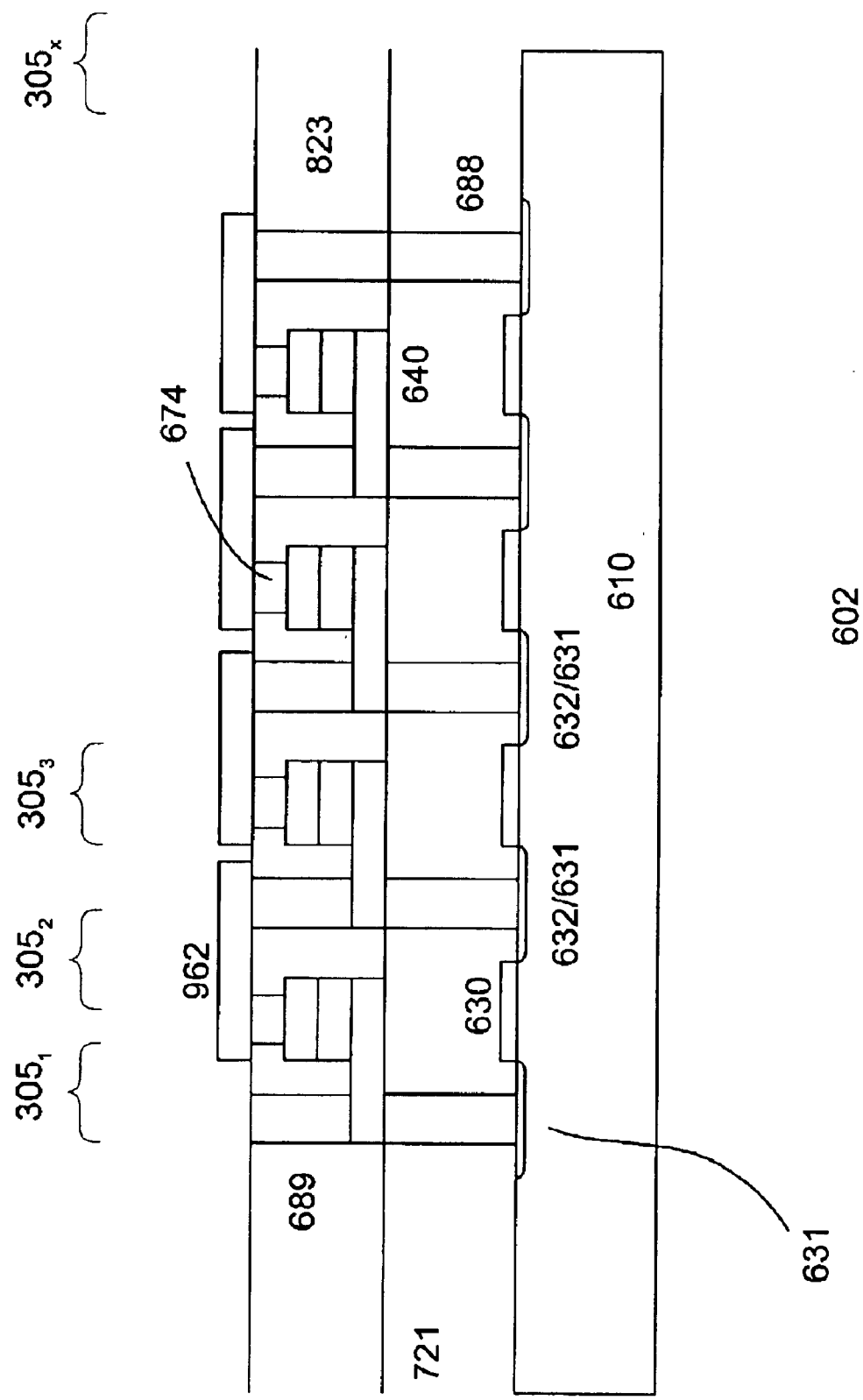

As shown in FIG. 10, a conductive layer is deposited over the dielectric layer 823 after plugs 689 and 674 are formed. In one embodiment, the conductive layer comprises aluminum. Other types of conductive materials, such as Cu, are also useful. The conductive layer is then patterned to form conductors 962, each coupling the top electrode of one capacitor to the bottom electrode of an adjacent capacitor. In an alternative embodiment, the conductors are formed using a damascene technique. Such techniques, for example, includes depositing a dielectric layer over dielectric layer 823, forming trenches therein, filling the trenches with conductive material, and removing excess conductive material from the surface of the dielectric layer by CMP. Also, forming the vias and conductors using dual damascene techniques are also useful.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:
   a memory series group having x number of memory cells, where x is a whole number greater than 1;
   wherein a memory cell of the series group includes
      a transistor having first and second diffusion regions and a gate, and a capacitor having a dielectric layer between first and second electrodes, and the first diffusion region is coupled to the first electrode and the second diffusion region is coupled to the second electrode; and the x number of memory cells are interconnected by having the second electrode of the $k^{th}$ memory cell coupled to the first electrode of $k^{th}$+1 memory cell, where K is from 1 to x−1, wherein an electric field applied to any of the capacitors daring a memory access is in the same direction.

2. The integrated circuit of claim 1 wherein the memory cells are ferroelectric memory cells in which the dielectric layer of the capacitor of the memory cells comprises a ferroelectric material.

3. The integrated circuit of claim 2 wherein a plurality of series groups are interconnected to form a memory array.

4. The integrated circuit of claim 1 wherein a plurality of series groups are interconnect to form a memory array.

5. The integrated circuit of claim 4 wherein the first electrode is first electrode is a top capacitor electrode and the second electrode is a bottom capacitor electrode.

6. The integrated circuit of any one of claims 1–5 wherein a first end of the series group is coupled to a bitline.

7. The integrated circuit of claim 6 wherein x is equal $2^y$, where y is equal to a whole number$\geq$1.

8. The integrated circuit of claim 6 wherein a second end of the series groups is coupled to a plateline.

9. The integrated circuit of claim 8 wherein x is equal $2^y$, where y is equal to a whole number$\geq$1.

10. The integrated circuit of claim 6 wherein the transistors of adjacent memory cells share a common diffusion region.

11. The integrated circuit of claim 9 wherein x is equal $2^y$, where y is equal to a whole number$\geq$1.

12. An integrated circuit comprising:

a plurality of memory series group having x number of memory cells interconnected to form a memory array, where x is equal to $2^y$ and y is a whole number greater than or equal to 1;

wherein a memory cell of a series group includes a transistor having first and second diffusion regions and a gate, and a capacitor having a ferroelectric dielectric layer between top and bottom electrodes, and the first diffusion region is coupled to the top electrode and the second diffusion region is coupled to the bottom electrode; and the x number of memory cells are interconnected by having the bottom electrode of the $k^{th}$ memory cell coupled to the top electrode of $k^{th}$+1 memory cell, where K is from 1 to x−1, wherein an electric field applied to any of the capacitors during a memory access is in the same direction.

13. An integrated circuit comprising:

a plurality of memory series group having x number of memory cells interconnected to form a memory array, where x a equal to $2^y$ and y is a whole number greater than or equal to 1;

wherein a memory cell of a series group includes a transistor having first and second diffusion regions and a gate, and a capacitor having a dielectric layer between top and bottom electrodes, and the first diffusion region is coupled to the top electrode and the second diffusion region is coupled to the bottom electrode; and the x number of memory cells are interconnected by having the bottom electrode of the $k^{th}$ memory cell coupled to the top electrode of $k^{th}$+1 memory cell, where K is from 1 to x−1, wherein an electric field applied to any of the capacitors during a memory access is in the same direction.

* * * * *